US006470433B1

(12) United States Patent
Prouty et al.

(10) Patent No.: US 6,470,433 B1
(45) Date of Patent: Oct. 22, 2002

(54) MODIFIED AGGRESSIVE PRECHARGE DRAM CONTROLLER

(75) Inventors: Bryan G Prouty, Wellington; Darel N Emmot, Ft Collins, both of CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/562,600

(22) Filed: Apr. 29, 2000

(51) Int. Cl.[7] .............................................. G06F 12/00
(52) U.S. Cl. ........................ 711/168; 711/105; 711/151; 711/170
(58) Field of Search ................................. 711/151, 158, 711/154, 105, 167, 168, 170; 365/233, 230.03, 203

(56) References Cited

U.S. PATENT DOCUMENTS

| | | | | |
|---|---|---|---|---|
| 5,600,605 A | * | 2/1997 | Schaefer ..................... 365/233 |
| 5,774,409 A | * | 6/1998 | Yamazaki et al. ...... 365/230.03 |
| 5,822,772 A | * | 10/1998 | Chan et al. ................. 711/158 |
| 5,889,714 A | * | 3/1999 | Schumann et al. ......... 365/203 |
| 5,995,438 A | * | 11/1999 | Jeng et al. ............. 365/230.03 |
| 6,154,414 A | * | 11/2000 | Lee ........................ 365/230.03 |
| 6,219,765 B1 | * | 4/2001 | Jeddeloh ..................... 711/154 |
| 6,233,661 B1 | * | 5/2001 | Jones et al. ................. 711/154 |
| 6,253,297 B1 | * | 6/2001 | Chauvel et al. ............. 711/167 |
| 6,269,433 B1 | * | 7/2001 | Jones et al. ................. 711/168 |

* cited by examiner

*Primary Examiner*—David Hudspeth
*Assistant Examiner*—Fred F. Tzeng
(74) *Attorney, Agent, or Firm*—Kevin M. Hart

(57) ABSTRACT

A modified aggressive precharge method and apparatus for controlling a DRAM or system of DRAMs. Groups of memory access commands are sent to a DRAM controller. A bank/row activate command indicator is associated with the beginning of each group, and a bank precharge command indicator is associated with the end of each group. Normally, the DRAM controller will close the bank/row corresponding to a group responsive to the bank precharge command indicator associated with the end of the group; but the DRAM controller may conditionally leave the bank/row open, as follows: The DRAM controller analyzes the command stream to determine whether first and second groups of memory access commands are directed to the same row and bank. If so, then the precharge command indicated at the end of the first group and the activate command indicated at the beginning of the second group are not executed. The effect is to leave the bank/row of the first group open so that the second group may access it without having to reopen it. Dead time associated with closing and re-opening the same bank/row is eliminated while the advantages of aggressive precharge are maintained.

17 Claims, 8 Drawing Sheets

FIG. 1
*(PRIOR ART)*

| | 100 | 102 | 104 | 106 | 108 | 110 | 112 | 114 | 116 | 118 | 120 |
|---|---|---|---|---|---|---|---|---|---|---|---|
| COMMAND BUS | A | A | WP | A | WP | A | WP | A | WP | A | WP |
| DATA BUS | | | DA0 DA1 | DA2 DA3 | DB0 DB1 | DB2 DB3 | DC0 DC1 | DC2 DC3 | DD0 DD1 | DD2 DD3 | DA1 DA2 ... |
| ADDRESS BUS | BA/R0 | BB/R0 | BA/C0 | BC/R0 | BB/C0 | BD/R0 | BC/C0 | BA/R1 | BD/C0 | BB/R1 | BA/C1 ... |

FIG. 2
*(PRIOR ART)*

| | 200 | 202 | 204 | 206 | 208 | 210 | 212 | 214 |
|---|---|---|---|---|---|---|---|---|
| COMMAND BUS | A | | WP | | A | | WP | |
| DATA BUS | | | DA0 DA1 | DA2 DA3 | | | DA4 DA5 | DA6 DA7 ... |
| ADDRESS BUS | BA/R0 | | BA/C0 | | BA/R0 | | BA/C4 | ... |

| 32 | 2 | 8 | 1 | 1 | 1 |
|---|---|---|---|---|---|
| DATA | BANK ADR | COL ADR | READ/WRITE | B4/B2 | L |

| 2 | 12 | 1 |
|---|---|---|
| BANK ADR | ROW ADR | ROW COMPARE |

```
1   void CommandProcessor( void )
2   {
3       InitalizeByLoadingAColumnCommandAndARowCommand( );
4       while( TRUE )
5       {
6           commandsAvailable = DetermineCommandsAvailable( );
7           selectedCommand = SelectCommand( commandsAvailable--);
8           if( selectedCommand == columnCmd )
9               ProcessColumnCommandWhenOKToProcessColumnCommand( );
10          else if( selectedCommand == rowCmd )
11              ProcessRowCommandWhenOKToProcessRowCommand( );
12      }
13  }
```

*FIG. 16A*

```
1   commandT SelectCommand( availableCmdT commandsAvailable )
2   {
3       switch( commandsAvailable )
4       {
5           case NONE:
6               return( null );
7               break;
8           case COLUMN_ONLY:
9               return( columnCmd );
10              break;
11          case ROW_ONLY:
12              return( rowCmd );
13              break;
14          case BOTH:
15              if( ColumnCommandIsDDRBurst4OrSDRBurst2 )
16                  return( columnCmd );
17              else return( rowCmd );
18              break;
19      }
20  }
```

*FIG. 16B*

```
1   void ProcessColumnCommand( )
2   {
3       if( SkewCountIsNonZero( columnCmdBankNum )
4       {
5           if( ColumnCommandIsPrechargeOnly )
6           {
7               LoadNextColumnCommand( ); /*throw it away */
8               return;
9           }
10          else if ( LastFlagAssertedInThisColumnCmd )
11          {
12              ConvertColumnCommandFromAutoprechargeTypeToNonAutoprechargeType( );
13              DecrementSkewCount( columnCmdBankNum );
14          }
15      }
16      if( PrechargeCommandWillAccompanyColumnCommand( )) MarkBankInactive( );
17      SendColumnCommandToDRAMSignaller( );
18      LoadNextColumnCommand( );
19      return;
20  }
```

FIG. 16C

```
1   void ProcessRowCommand( )
2   {
3       deleteActivateCommand = SkewCountIsLessThanMax( rowCmdBankNum ) &&
4                               BankIsActive( rowCmdBankNum ) &&
5                               RowMatchBitIsAsserted( );
6
7       if( deleteActivateCommand )
8       {
9           IncrementSkewCount( rowCmdBankNum );
10          LoadNextRowCommand( );   /*throw this row command away */
11      }
12      else
13      {
14          MarkBankActive( );
15          SendRowCommandToDRAMSignaller( );
16          LoadNextRowCommand( );
17      }
18      return;
19  }
```

FIG. 16D

MODIFIED AGGRESSIVE PRECHARGE DRAM CONTROLLER

FIELD OF THE INVENTION

This invention relates to memory controllers. More particularly, the invention relates to controllers for DRAM memories wherein pages, subpages or rows must be activated before accesses can be made to the pages, subpages or rows.

BACKGROUND

An individual memory location in a dynamic random access memory ("DRAM") is specified using a row address and a column address. A particular row in a DRAM is commonly referred to as a "page" of memory. It is common to organize multiple DRAM chips into multiple banks to form a larger memory system. It is also common to organize each individual DRAM chip into multiple banks internally. Further, multi-bank memory systems may be formed using chips that have multiple banks internally. In any of these kinds of multiple-bank systems, a bank address is needed in addition to a row address and column address to specify a single memory location.

Prior to accessing a target memory location in a multi-bank DRAM system, the target memory location's host row and bank must first be activated. After the bank/row activation step has been completed, multiple accesses to columns within the activated bank/row may be performed. Prior to activating and accessing a different row within the same bank, the previously-accessed bank must be precharged. The precharge step is commonly referred to as "closing" a bank/row within the DRAM. Generally speaking, one row in each bank may be active or "open" at any given time in a multi-bank chip. Thus, in a four-bank DRAM, four rows may be active simultaneously.

Each time an activate or precharge command is executed on a given bank, a certain amount of dead time is encountered in relation to memory accesses that could be performed on that bank. For example, after a bank/row activate command is issued to the DRAM chip, the memory controller must wait a predetermined minimum time prior to issuing reads or writes to column addresses within the activated bank/row. Similarly, the memory controller must wait a predetermined minimum time after issuing a precharge command to a bank before issuing an activate command to the same bank. The dead time that results from performing bank/row activates and precharges on the DRAM can dramatically affect the bandwidth that is available for executing memory accesses. For this reason, one of the primary concerns in memory controller design is to determine when precharge commands should be issued to the DRAM.

One prior art strategy in this regard is called the "aggressive precharge" strategy. In a memory controller that employs the aggressive precharge strategy, memory access commands are sent to the memory controller in groups. Prior art aggressive precharge memory controllers are designed to assume that each sequential group of memory access commands will be directed to a different bank/row than was the previous group of memory access commands. For every group, therefore, when the last command in the group is being executed, the prior art aggressive precharge memory controller automatically closes the bank/row being accessed. The chief advantage of the aggressive precharge strategy is that it leaves each bank/row of the DRAM in a ready-to-activate state. When a bank/row needs to be accessed, it need only be activated; it need not be precharged and then activated.

In many DRAM chips, "autoprecharge" memory access command types are provided. In essence, an autoprecharge memory access command is a compound command that combines a read or write burst command with a precharge command. For example, many DRAMs provide a compound burst-read-with-autoprecharge command and a compound burst-write-with-autoprecharge command in addition to simple burst read, burst write, precharge and activate commands. Most prior art aggressive precharge memory controllers make use of the compound command types in lieu of the simple command types in order to conserve memory bandwidth as much as possible.

By way of example, FIG. 1 illustrates an efficient set of sequential writes issued by an aggressive precharge DRAM controller to a dual data rate DRAM memory system. (In a dual data rate DRAM, the data bus clock speed is typically twice that of the command bus and the address bus.) In this example, four groups of writes are executed. Each sequential group is directed to a different bank of the DRAM, and each group includes four data units to be written. (For simplicity, a group size equals a burst size in this example; in the general case, a group would typically be larger than a burst size.) At time 100, an activate command A is issued to activate bank A row 0. At time 102, an activate command A is issued to activate bank B row 0. At time 104, the required minimum wait time for bank A will have passed, so a burst-write-with-autoprecharge command WP is issued to bank A column 0. This begins a four-unit burst write to bank A indicated on the data bus as DA0–DA3. While the burst write to bank A is still in progress, an activate command may be issued to bank C row 0 as shown at time 106. Thereafter, activate commands A and burst-write-with-autoprecharge commands WP can be alternated on the command bus as shown at times 108–120. Each time an activate command is issued, the corresponding bank address and row address are presented on the address bus. By alternating the banks being accessed in this manner (and by alternating the corresponding activate and write commands as shown), the bandwidth of the data bus is maximized: As can be seen in the diagram, every cycle of the data bus is utilized with write data after time 104. Generally speaking, the same result may be achieved when the group sizes are longer than a burst size. In such a case, more than one burst write would be issued for each group. By alternating the banks being accessed by sequential groups, wasted states on the data bus are eliminated.

By contrast, what happens in a prior art aggressive precharge system when two sequential groups of memory access commands are directed to the same row and bank? This condition is illustrated in FIG. 2. (The example of FIG. 2 is again simplified for illustration by assuming that a group size equals a burst size.) An activate command A for the first group is issued at time 200 to bank A row 0. The burst write starting at bank A column 0 begins at time 204 after the required activation wait time has been observed during time 202. Consistent with the behavior of prior art aggressive precharge systems, the write command issued at time 204 autoprecharges bank A. In the example being illustrated, however, the next group happens to be directed to the same bank and row as the previous group. Thus, another activate command A must be issued at time 208 to reactivate bank A row 0. The activate command issued at time 208 cannot be issued sooner because most multi-bank DRAMs do not allow an activate command to be issued to a bank while write data is being clocked into that bank. The burst write for the second group begins at time 212 after the required activation wait time has been observed during time 210. The result of having the same bank/row accessed back-to-back by two groups is that the data bus states corresponding to times 208 and 210 have been wasted. This inability to efficiently perform back-to-back same bank/row memory accesses represents a significant limitation of prior art aggressive precharge memory controllers.

It is therefore an object of the invention to improve the bandwidth efficiency of aggressive precharge DRAM memory controllers in the context of performing back-to-back same bank/row memory accesses.

SUMMARY OF THE INVENTION

In one aspect, the invention includes a modified aggressive precharge method and apparatus for controlling a DRAM or system of DRAMs. Groups of memory access commands are sent to a DRAM controller. A bank/row activate command indicator is associated with the beginning of each group, and a bank precharge command indicator is associated with the end of each group. Normally, the DRAM controller will close the bank/row corresponding to a group responsive to the bank precharge command indicator associated with the end of the group; but the DRAM controller may conditionally leave the bank/row open, as follows: The DRAM controller analyzes the command stream to determine whether first and second groups of memory access commands are directed to the same row and bank. If so, then the precharge command indicated at the end of the first group and the activate command indicated at the beginning of the second group are not executed. The effect is to leave the bank/row of the first group open so that the second group may access it without having to reopen it. Thus, dead time associated with closing and re-opening the same bank/row is eliminated while the advantages of aggressive precharge are maintained.

In a further aspect, the address of the most recently activated row is stored for each bank of the DRAM. This is done because the processing of different groups of memory accesses does not necessarily happen in a temporally contiguous manner. Each time a new bank/row activate command is indicated by the command stream, the address of the new row is compared with the address of the most recently activated row for the corresponding bank. One bit is appended to the new bank/row activate command to indicate the result of the comparison. In addition, an active/inactive status bit is maintained for each bank of the DRAM. The status bit for a bank is set when the bank is activated and is reset when the bank is precharged. When the bank/row activate command nears the point of execution, the memory controller analyzes the newly-added row comparison bit in the command as well as the status bit for the bank that corresponds to the command. If the row comparison bit is asserted and the corresponding bank is active, then the bank/row activate command is discarded instead of executed.

In a still further aspect, a count of the number of activate commands so discarded is maintained for each bank of the DRAM. Whenever an activate command is discarded, the corresponding count is incremented. Each time a precharge command indicator is encountered in the command stream, the count for the corresponding bank is analyzed. If the count is nonzero, then the precharge command is discarded instead of executed and the count is decremented. In this manner, skew that may result from queuing bank/row commands separately from bank/column commands is tracked to ensure that the number of activate commands and precharge commands discarded for a given bank will be equal. This is important because, due to the manner in which groups occur and are processed, the activate and precharge commands that form a corresponding pair may be encountered at widely separated times.

The invention has been implemented and is described herein in the context of a computer graphics memory controller. In a computer graphics system, memory accesses tend to come in groups that are bank/row coherent. This is so partly because graphics rendering data are derived from polygons that define areas, and because memory mapping schemes are generally used in graphics systems so that bank/row coherency is maintained across certain areas. (Similarly, display refresh data tend to be bank/row coherent because they are coherent along raster lines.) But the scope of the invention described and claimed herein is not limited to the computer graphics context; it will also have beneficial application in any aggressive precharge memory control system in which memory access commands tend to come in bank/row coherent groups. For example, in any computer system that uses a cache, main memory accesses will typically take the form of groups that correspond to cache misses, wherein one line of the cache maps to all or part of one bank/row in the DRAM. The ability to preserve memory bandwidth while performing back-to-back accesses to the same bank/row will enhance the performance of any such systems.

BRIEF DESCRIPTION OF THE DRAWINGS

FIG. 1 is a timing diagram illustrating an efficient set of sequential write commands executed by a prior art aggressive precharge DRAM controller.

FIG. 2 is a timing diagram illustrating an inefficiency that results in prior art aggressive precharge memory controllers when the same row and bank are accessed back-to-back by two groups of memory accesses.

FIGS. 16A–D are pseudocode listings that describe preferred behavior for the command processor of FIG. 5.

DETAILED DESCRIPTION OF THE PREFERRED EMBODIMENTS

An example host system. Embodiments of the invention will find useful application in a variety of environments. For purposes of illustration herein, a preferred embodiment of the invention will be described in the context of a computer graphics system. As was explained above, memory accesses in computer graphics systems lend themselves to bank/row coherent grouping. Persons having ordinary skill in the art will appreciate, however, that computer graphics systems are not the only host systems that will benefit from the advantages provided by the invention. For example, groups of memory accesses generated by cache systems tend to be bank/row coherent also. Therefore, the host system and embodiments described herein are provided by way of illustration and not by way of limitation.

Figure 3:
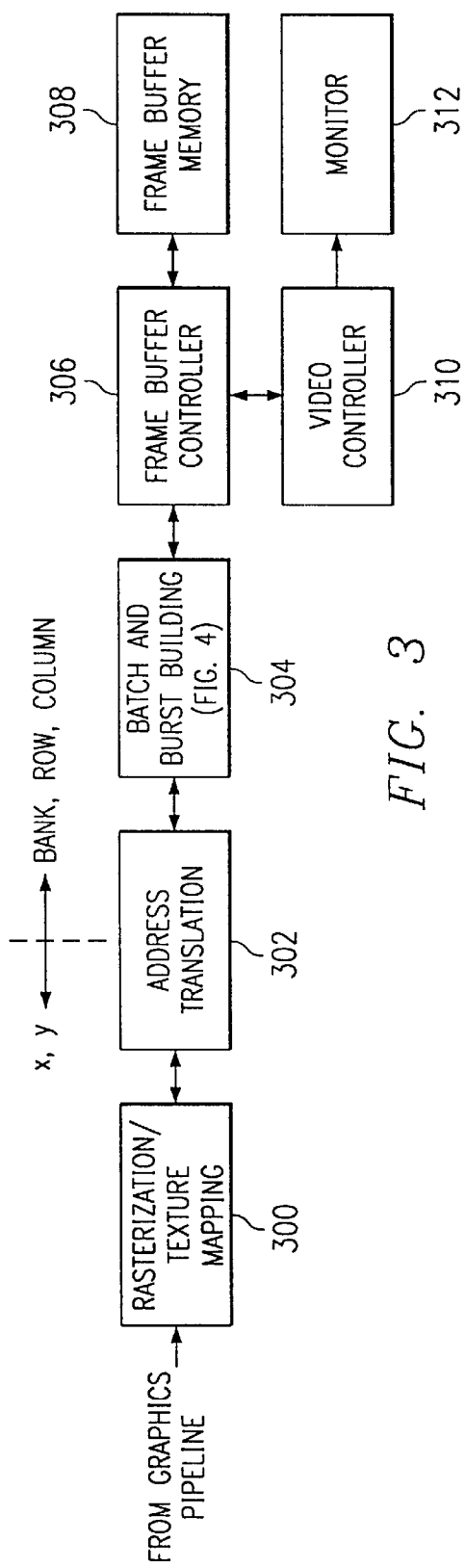
FIG. 3 is a block diagram illustrating a portion of a computer graphics pipeline in which an embodiment of the invention may find useful application.

FIG. 3 illustrates a portion of a computer graphics pipeline in which an embodiment of the invention may find useful application. Graphics primitives are typically produced in such a system using three-dimensional model coordinates. Once the primitives are produced and modified by a portion of the graphics hardware pipeline that is upstream of that shown in FIG. 3, the primitives are rasterized in block 300. Optionally, texture mapping may also be performed in block 300. In block 302, memory accesses coming from block 300 are translated from an x/y coordinate system into banks/rows/columns corresponding to the address space of DRAM frame buffer memory system 308. In block 304, these translated memory access are sorted into groups that are bank/row coherent and command-type coherent. (For example, one group of memory accesses might contain pixel reads to bank A row 0 columns 0–31, while another group might contain pixel writes to bank B row 7 columns 256–287, and so on.)

Preferably block 302 will be operable to associate a "first" or "F" flag with the first memory access command in a group and a "last" or "L" flag with the last memory access in the group. When groups of memory accesses are delimited in this manner, all groups need not have the same size. Alternatively, other techniques may be used to delimit groups. For example, if all groups will have the same size, the first and last flags may be implied. In addition to flags for delimiting groups, block 304 may associate a B4/B2 flag with a memory access command to indicate whether it corresponds to a 4-unit or a 2-unit burst access.

Figure 4:
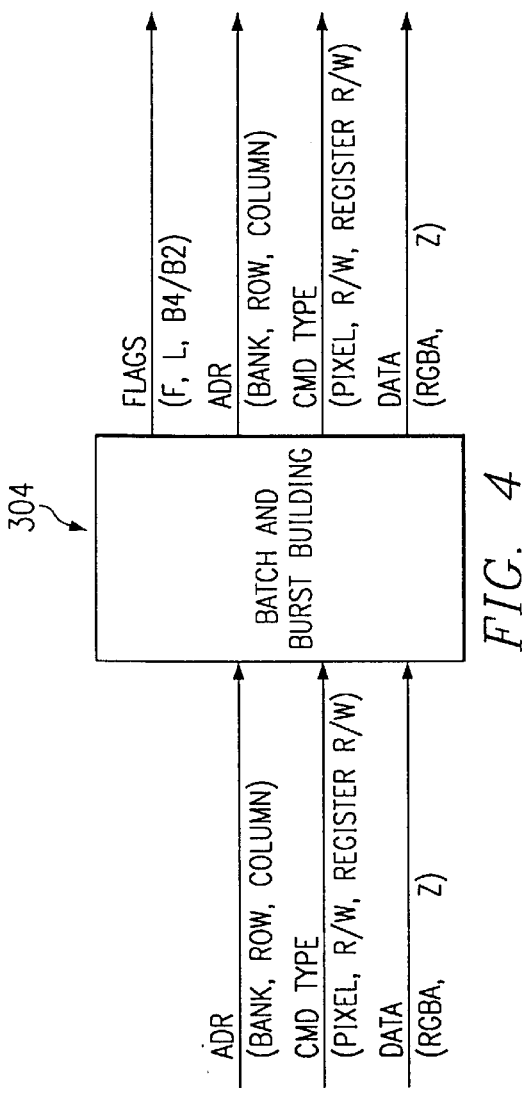
FIG. 4 is a block diagram illustrating the batch and burst building block of FIG. 3 in more detail.

For clarity and completeness, FIG. 4 is provided to suggest an appropriate set of inputs and outputs for block 304. Each input to the block includes an address (bank/row/column), a command type (such as pixel read, register write, etc.) and a unit of data (such as RGBA data and Z data). Each output from the block includes an address (bank/row/column), a command type (such as pixel read, register write, etc.), a unit of data (such as RGBA data and Z data), and a set of flags (such as the F, L and B4/B2 flags described in the preceding paragraph). One possible implementation for a batch and burst building block such as block 304 is described in the following two United States patent applications, both of which applications are hereby entirely incorporated by reference: Ser. No. 09/364,973, filed Jul. 31, 1999, titled "Creating Page Coherency and Improved Bank Sequencing in a Memory Access Command Stream"; and Ser. No. 09/364,971, filed Jul. 31, 1999, titled "Creating Column Coherency for Burst Building in a Memory Access Command Stream."

In the host system of FIG. 3, a modified aggressive precharge memory controller according to the invention would typically be implemented within frame buffer controller 306. Frame buffer controller 306 handles memory requests from all processes needing access to frame buffer memory 308, including requests from the display system which continuously reads pixel intensity values from frame buffer memory 308 and sends them to video controller 310, which in turn drives a display such as monitor 312. The invention may also be implemented at other locations within a given host system, of course, as circumstances suggest or require.

Figure 5:
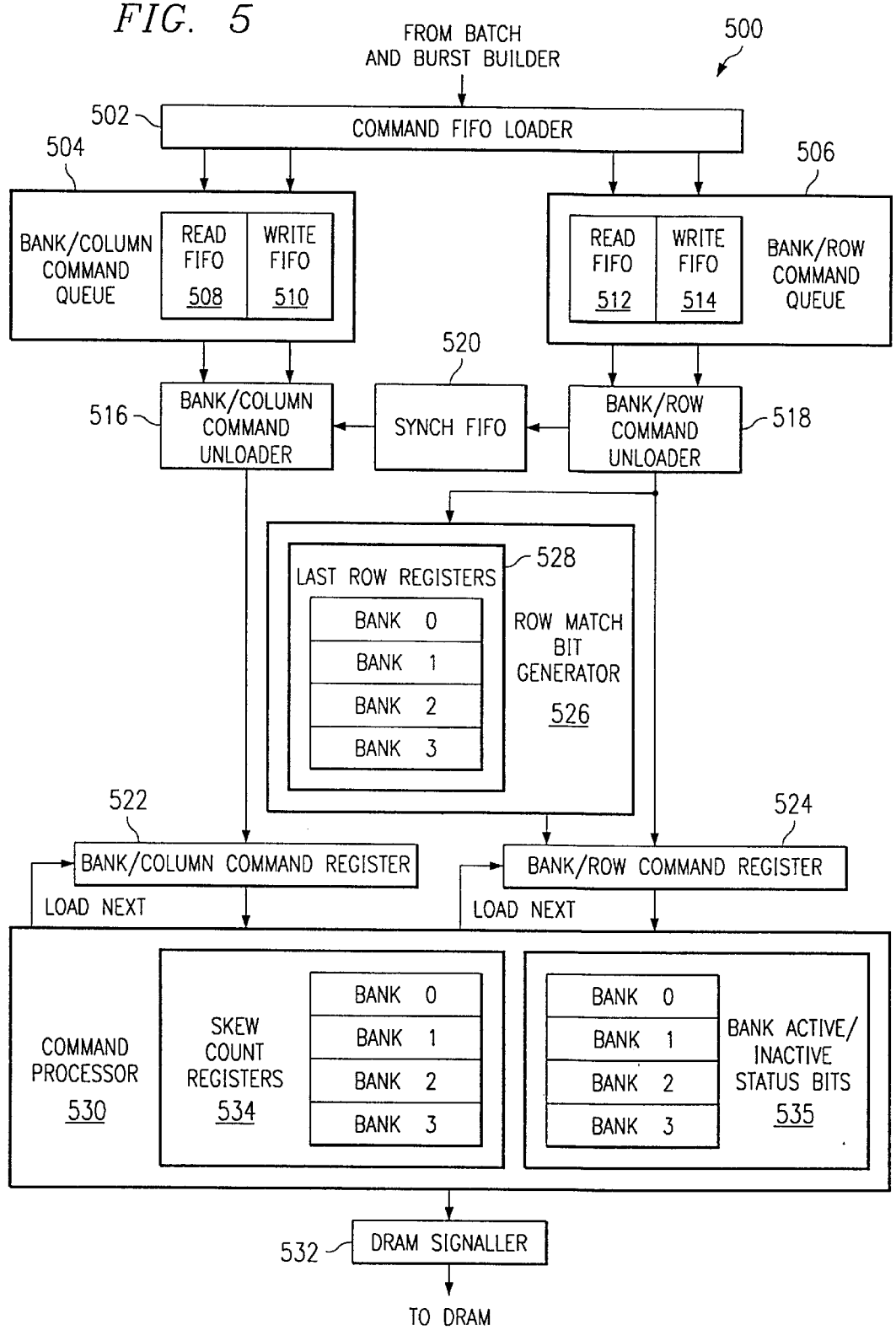
FIG. 5 is a block diagram illustrating a preferred embodiment of the invention within the frame buffer controller block of FIG. 3.
Figure 6:
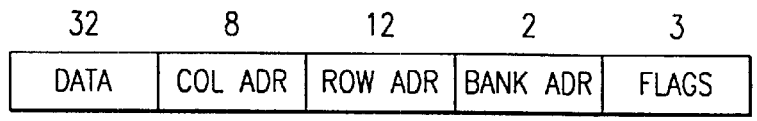
FIG. 6 is a block diagram illustrating a preferred data format for write commands entering the command FIFO loader of FIG. 5.
Figure 7:
FIG. 7 is a block diagram illustrating a preferred data format for read commands entering the command FIFO loader of FIG. 5.

A preferred embodiment of the invention. FIG. 5 illustrates the components of a modified aggressive precharge memory controller 500 according to a preferred embodiment of the invention. A command FIFO loader block 502 receives memory access commands from batch and burst building block 304. Write commands entering block 502 may have the data format suggested in FIG. 6 (32 bits of data, 8 bits of column address, 12 bits of row address, 2 bits of bank address, and 3 bits of flags). Read commands entering block 502 may have the data format suggested in FIG. 7 (8 bits of column address, 12 bits of row address, 2 bits of bank address, and 3 bits of flags).

FIFO loader block, bank/column and bank/row command queues. The primary purpose of command FIFO loader block 502 is to fill command queues 504 and 506 with memory access commands derived from the output of batch and burst building block 304. At this point in the pipeline, a single stream of memory access commands exiting block 304 is split into two separate streams: a bank/column command stream and a bank/row command stream. The bank/row command stream corresponds to bank/row activates for each new group of memory accesses. The bank/column command stream corresponds to memory read/write commands within a group of memory accesses. Typically, numerous entries would exist in the bank/column command queue for every one entry in the bank/row command queue.

Figure 8:
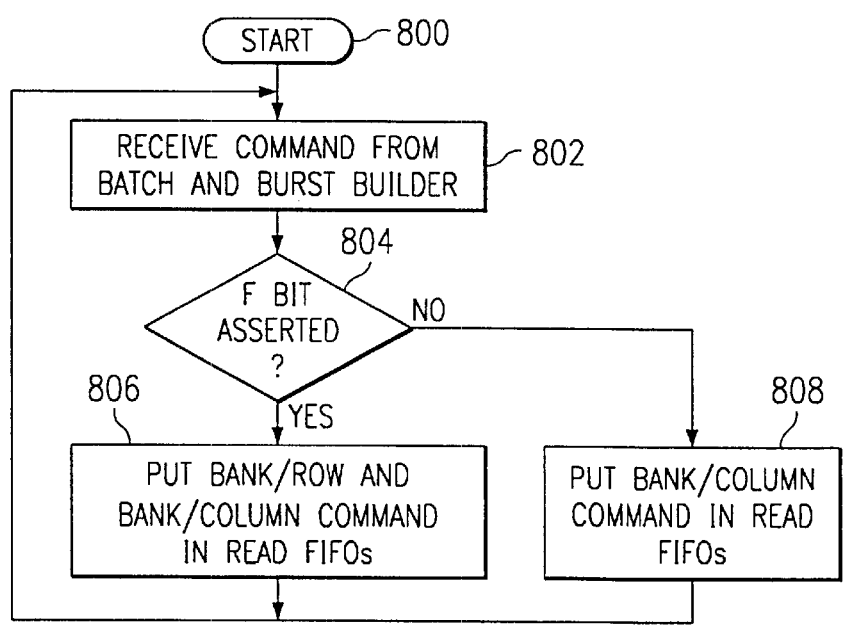
FIG. 8 is a flow diagram illustrating preferred functionality for the command FIFO loader of FIG. 5.
Figure 9:
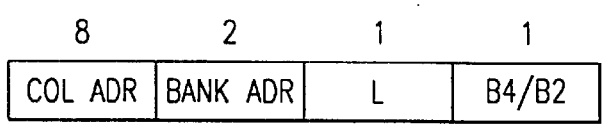
FIG. 9 is a block diagram illustrating a preferred data format for bank/column commands inside the read FIFO of the bank/column command queue of FIG. 5.
Figure 10:
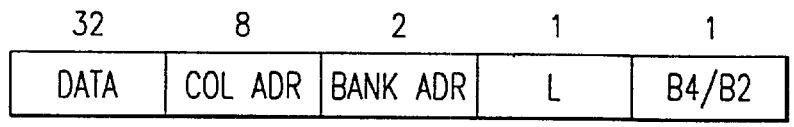
FIG. 10 is a block diagram illustrating a preferred data format for bank/column commands inside the write FIFO of the bank/column command queue of FIG. 5.

FIG. 8 explains the command FIFO loader process in more detail. Starting at step 800, block 502 receives a memory access command in step 802 from batch and burst building block 304. The F flag associated with the command is checked in step 804. If the F flag is asserted (indicating that this is the first command in a new group), then block 502 will do two things in step 806: It will place a bank/row activate command indicator in bank/row command queue 506, and it will also place a bank/column command indicator in bank/column command queue 504. On the other hand, if the F flag is not asserted (indicating that this is not the first command in a new group), then block 502 will only do one thing in step 808: It will merely place a bank/column command indicator in bank/column command queue 504. In either case, operation resumes at step 802 wherein block 502 receives another command from batch and burst building block 304.

Suggested data formats for each of the commands stored in command queues 504 and 506 will now be described with reference to FIGS. 9–12. A read command in bank/column command queue 504 would be placed in read FIFO 508 and may have the data format shown in FIG. 9 (8 bits of column address, 2 bits of bank address, 1 bit of L flag, 1 bit of B4/B2 flag, and 1 bit of NW flag). A write command in bank/column command queue 504 would be placed in write FIFO 510 and may have the data format shown in FIG. 10 (32 bits of data, 8 bits of column address, 2 bits of bank address, 1 bit of L flag, and 1 bit of B4/B2 flag).

Figure 11:
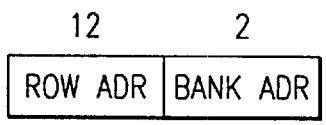
FIG. 11 is a block diagram illustrating a preferred data format for bank/row commands inside the read and the write FIFOs of the bank/row command queue of FIG. 5.

A bank/row activate command corresponding to a group of read accesses would be stored in read FIFO 512 within command queue 506 and may have the data format shown in FIG. 11 (12 bits of row address, 2 bits of bank address). A bank/row activate command corresponding to a group of write accesses would be stored in write FIFO 514 within command queue 506 and may have the same data format as that shown in FIG. 11 (12 bits of row address, 2 bits of bank address).

It should be noted here that, in an actual computer graphics system, other FIFOs may also exist in command queues 504 and 506. For example, one set of read FIFOs might be provided for texture accesses, a set of read and write FIFOs might be provided for pixel accesses, and a read FIFO might be provided for display system access. These specific aspects of a computer graphics frame buffer controller are not particularly germane to the invention being claimed herein; therefore, they will not be described in any further detail. It will suffice herein to describe a system having a generic read FIFO and a generic write FIFO in each command queue.

Figure 12:
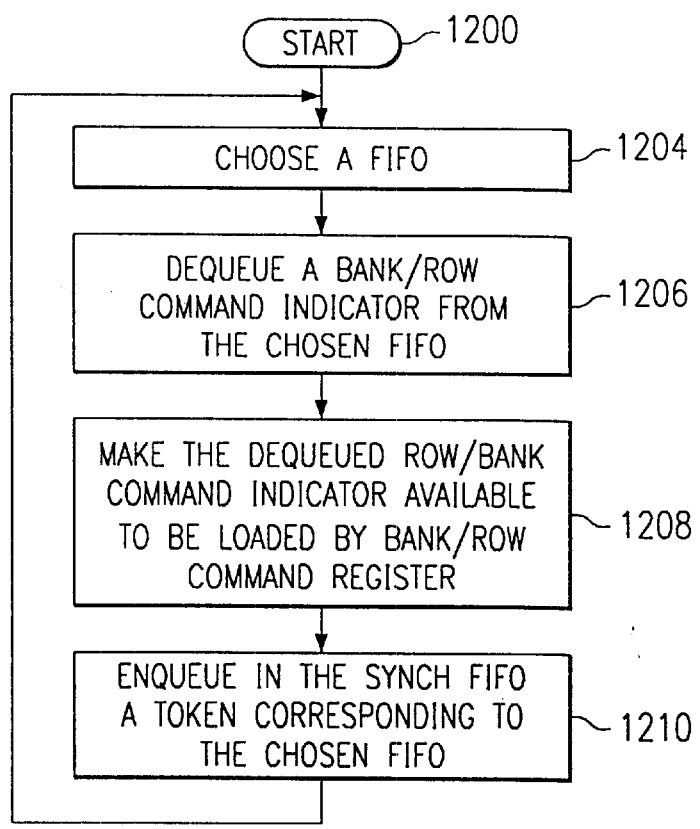
FIG. 12 is a flow diagram illustrating preferred functionality for the bank/row command unloader of FIG. 5.

Command queue unloader blocks. FIG. 12 illustrates the functions performed by bank/row command unloader 518. Starting with step 1200, unloader 518 chooses (in step 1204) a FIFO within bank/row command queue 506 to dequeue. In the illustrated embodiment, this would simply involve choosing between read FIFO 512 and write FIFO 514. In the illustrated as well as in a more elaborate system like the one described in the preceding paragraph, the process of choosing which FIFO to dequeue should be guided by considerations such as minimizing read-to-write transitions and write-to-read transitions, as well as by other priorities such as the timing constraints that are imposed by the video display system and DRAM refresh system.

Once a bank/row command FIFO is chosen in step 1204, one bank/row command indicator is dequeued from the chosen FIFO in step 1206. In step 1208, the dequeued command indicator is made available to be loaded by bank/row command register 524. Also, in step 1210, a token is enqueued into synchronization FIFO 520. This token will identify which FIFO was chosen and dequeued in bank/row command queue 506 so that the corresponding FIFO may be dequeued in bank/column command queue 504. Operation resumes at step 1202.

Figures 13, 14, 15:
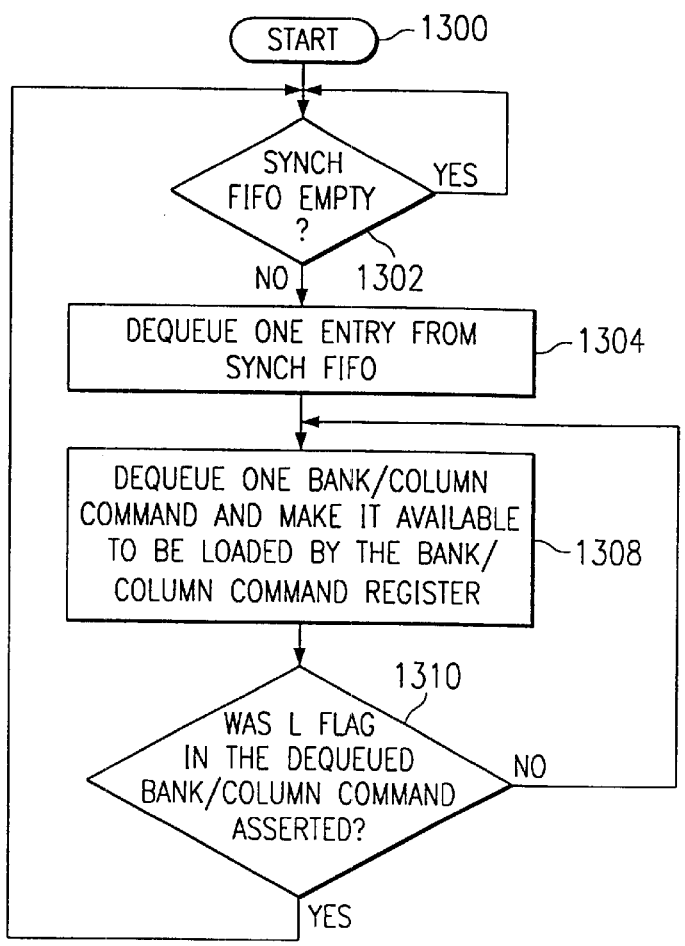
FIG. 13 is a flow diagram illustrating preferred functionality for the bank/column command unloader of FIG. 5.
FIG. 14 is a block diagram illustrating a preferred data format for a bank/column command stored in the bank/column command register of FIG. 5.
FIG. 15 is a block diagram illustrating a preferred data format for a bank/row command stored in the bank/row command register of FIG. 5.

FIG. 13 illustrates the functions performed by bank/column command unloader 516. Starting with step 1300, command unloader 516 waits in step 1302 until synchronization FIFO 520 is non-empty. It then dequeues one entry from synchronization FIFO 520 in step 1304. In step 1308, one bank/column command is dequeued from either read FIFO 508 or write FIFO 510, depending on which FIFO was indicated by the synchronization entry that was dequeued from synchronization FIFO 520. The dequeued bank/column command is made available to be loaded by bank/column command register 522. If the L flag in the dequeued bank/column command was asserted, then operation resumes at step 1302. Otherwise, the process continues looping through steps 1308 and 1310 so that further bank/column commands will be dequeued from the same bank/column command FIFO until an asserted L flag is found.

Command registers. The data format for bank/column commands loaded into bank/column command register 522 may be as shown in FIG. 14 (32 bits of data for write commands, 2 bits of bank address, 8 bits of column address, 1 bit indicating the command type, 1 bit indicating burst-4 or burst-2, and 1 bit of L flag). The data format for bank/row commands loaded into bank/row command register 524 may be as shown in FIG. 15 (2 bits of bank address, 12 bits of row address, and 1 bit of row match flag). The significance of the row match flag will be explained next.

Row match bit generator. Before a bank/row command is made available by command unloader 518 to be loaded into bank/row command register 524, it is made available to row match bit generator 526. Row match bit generator 526 does three things for each such command: First, it compares the row address for the new command with a stored row address inside last row registers 528. The specific last row register used in the comparison is selected using the bank address of the new bank/row command. Second, if the row addresses so compared are equal, then the row compare bit (see FIG. 15) is asserted by row match bit generator 526 and associated with the new command; if the row addresses are unequal, then the row match bit associated with the new command will be deasserted. Third, row match bit generator 526 stores the row address for the new command in the last row register selected by the bank address for the new command. In this manner, the last row activated in each bank will be remembered by last row registers 528.

Command processor and DRAM signaler blocks. Command processor 530 and DRAM signaler 532 are shown as separate blocks in FIG. 5 primarily to simplify their discussion. Persons having ordinary skill in the art will appreciate that it may be preferable in practice to combine the functionality of command processor 530 and DRAM signaler 532 into a single state machine.

The construction of DRAM signaler 532 need not be described in detail herein. It will suffice to say that DRAM signaler 532 is responsible for driving the DRAM chip or chips that constitute frame buffer memory 308. Signaler 532 does so by translating command indications coming from command processor 530 into the timing and assertion levels required by the pins of the DRAM as dictated by the DRAM chip specification. For example, DRAM signaler 532 would translate such command indications as activate, precharge, burst4-read-with-autoprecharge, burst4-write-with-autoprecharge, simple burst4 write and simple burst4 read into the corresponding patterns on the pins of the DRAM as dictated by the DRAM manufacturer.

Command processor 530 preferably includes skew count registers 534, which registers include one skew count register for each bank of the DRAM. These registers are used to make certain for each bank that, when a given number of bank/row activate commands are discarded instead of executed, the same number of bank precharge commands will be discarded instead of executed. While these count registers may have any size, it was determined that a 2-bit counter is adequate for each bank given the relatively low probability of having more than four groups access the same row of one bank without any intervening rows being accessed in that bank. If the invention is applied in a different type of host system, or in a substantially different type of computer graphics system, then a maximum skew count of more or less than four may be more appropriate depending on the circumstances.

Command processor 530 preferably also includes bank active/inactive status bits 535. Each time a row in a given bank is activated by issuance of a bank/row activate command, the active/inactive status bit for the corresponding bank should be asserted. Similarly, each time a bank is precharged, the active/inactive status bit for the corresponding bank should be deasserted. In this manner, status bits 535 will always reflect the current active/inactive status for the banks of the DRAM.

FIGS. 16A–D provide pseudocode illustrating a preferred set of functions to be performed by command processor 530. FIG. 16A describes the main functionality of command processor 530 using a procedure called CommandProcessor. In line 3, initialization is performed by loading any available commands into bank/column command register 522 and bank/row command register 524. This may be accomplished by asserting the "load next" input of each register (see FIG. 5). Thereafter, command processor 530 continuously loops as follows: In line 6, a procedure is performed whose purpose is simply to determine which combination of commands is available in registers 522 and 524. (Is a command available in both registers, one of the two registers, or neither register?) In line 7, this information is used by a procedure called SelectCommand. The purpose of Select Command is to choose from which of registers 522 and 524 the next command will be taken.

SelectCommand is described in detail in FIG. 16B, wherein the main function performed is represented as a switch statement. Referring now to FIG. 16B, if no commands are available (line 5), then no command is selected. If only a bank/column command is available (line 8), then the available bank/column command is selected. If only a bank/row command is available (line 11), then the available bank/row command is selected. If both a bank/column command and a bank/row command are available (line 14), then further decisions are required:

In line 15, a determination is made whether the available bank/column command will require sufficiently long to execute that a bank/row command may also be issued while the bank/column command is still executing. This would be the case, for example, if the DRAM is a dual data rate RAM and the available bank/column command is a burst4 read or write command. This would also be the case if the DRAM is a single data rate RAM and the available bank/column command is a burst2 read or write command. On the other hand, a burst2 on a dual data rate RAM would not provide an opportunity to issue a second command on the command bus while the burst was still executing. Similarly, a burst1 command on a single data rate RAM would not provide that opportunity.

Other types of RAMs such as, for example, nonsynchronous RAMs or RAMs manufactured by RAMBUS, Inc. may also provide opportunities to issue a second command while a first command is executing, thereby preserving memory bandwidth. Regardless of which type of RAM is being used, if it is the case that the available bank/column command is of the type that allows a second command to be issued while a first command is still executing, then the available bank/column command will be selected in lieu of the available bank/row command. If this is not the case, then the available bank/row command is selected instead of the bank/column command.

Returning now to FIG. 16A, the selected command (if any) is executed in lines 8–11. The procedures "Process Column Command When OK To Process Column Command" and "Process Row Command When OK To Process Row Command" are so named because neither command can be executed until proper timing constraints of the DRAM have been observed. Persons having ordinary skill in the art and having reference to a DRAM manufacturer's specification will appreciate how to determine whether the DRAM is in a proper condition to receive a new command at any moment given the command type and other pertinent DRAM and system state information. Once it is determined that a command may be executed, either the ProcessColumnCommand procedure (FIG. 16C) or the ProcessRowCommand procedure (FIG. 16D) may be performed. It is during these two procedures that skew count registers 534 are used.

Processing of Command Register Entries in General. Command processor 530 treats the entries in command registers 522 and 524 as command indicators. For example, command processor 530 will treat an entry in bank/row command register 524 as indicating that an activate command should be issued to the bank and row address specified by the register entry. Similarly, command processor 530 will treat an entry in bank/row command register 522 as indicating that some form of read or write command should be issued to bank and column address specified by the register entry (it is assumed that the correct row in the specified bank has already been activated). During normal operation, command processor 530 assumes that a bank/column command having its L flag asserted should be issued using a compound "with autoprecharge" command type. For example, a bank/column read command with its B4/B2 flag asserted and its L flag asserted would result in a "burst4-read-with-autoprecharge" command being issued to DRAM signaler 532. On the other hand, command processor 530 will use a non-autoprecharge command type to execute any bank/column command whose L flag is not asserted. Thus, the L flag of a bank/column command can be thought of as constituting an "implied" precharge command.

ProcessColumnCommand. Referring now to FIG. 16C, when a bank/column command is chosen for execution, the skew count register for the corresponding bank is selected using the bank address carried with the bank/column command. If the count contained in the accessed skew count register is non-zero (line 3), then further processing depends on whether the bank/column command is explicit or implicit (express or implied). An example of an explicit bank/column command would a precharge command inserted into the command stream simply for the purpose of performing a DRAM refresh cycle. An implicit bank/column command would be one that is generated to perform a read or write access corresponding to a memory location whose address is specified in register 522. If the command is explicit (for example, if it is a precharge corresponding to a refresh cycle as in line 5), then the command is simply discarded, and the next bank/column command is loaded into bank/column command register 522. But if the command is implicit (for example, generated to perform an actual memory access command as in lines 10 and following), then the command itself will not be discarded. The command may, however, be modified in the sense that an "implied" precharge included in the command may be discarded:

If the L flag carried with the command is asserted (line 10) then the command is converted from an autoprecharge command type to the corresponding non-autoprecharge command type. For example, if the command indicated were a compound "write-burst4-with-autoprecharge," then the command would be converted to a simple "write-burst4." Depending on the nature of the DRAM being controlled, this conversion may simply involve altering the assertion level of a single pin of the DRAM with the command is issued to the DRAM. When a bank/column command is so converted, the autoprecharge aspect of the command has effectively been discarded instead of executed. Thus, the skew count register for the bank accessed by the command is decremented by one (line 13). The bank/column command is executed in line 16, and the next bank/column command is loaded into bank/column command register 522 in line 17. If it is determined in line 10 that the L flag carried with the command is not asserted, then the bank/column command is simply executed as usual and the next command is loaded (lines 16–18). Note that, in line 16, the active/inactive status bit 535 for the bank corresponding to the bank/column command is deasserted (marked as inactive) if a precharge operation is being executed.

ProcessRowCommand. Referring now to FIG. 16D, when a bank/row command is chosen for processing, a determination is made in line 3 whether or not the command will be discarded instead of executed. The command will be discarded if all three of the following propositions are true: (1) the value contained in the skew count register selected by the bank address for this bank/row command is less than its maximum value; (2) the bank corresponding to this bank/row command is already active; and (3) the row match bit in this bank/row command is asserted. If all three of these propositions are true, then the row and bank to be accessed by the pending group was already opened by a previous group. Therefore, it need not be re-opened, and the bank/row activate command may be discarded instead of executed. If so, the skew count register for the bank corresponding to the discarded bank/row command is incremented by one (line 9), and the next bank/row command is loaded into bank/row command register 524 (line 10). If it is determined in line 3 that the bank/row command cannot be discarded, then the command is executed as usual and the next bank/row command is loaded into bank/row command register 524 (lines 15–16). Importantly, the active/inactive status bit 535 for the affected bank is asserted (marked active) in line 14.

While the invention has been described in detail in relation to a preferred embodiment thereof, the described embodiment has been presented by way of example and not by way of limitation. It will be understood by those skilled in the art that various changes may be made in the form and details of the described embodiment without deviating from the spirit and scope of the invention as defined by the appended claims. For example, while in some implementations the memory access commands within a "group" may all be of the same type (e.g. all read commands or all write commands, all pixel commands or all texture commands), in other implementations the types of commands in a group may be freely mixed. A group may contain commands of any type including but not limited to reads, writes, pixel accesses, texture accesses or other kinds of accesses. The invention as claimed herein encompasses all such implementation variants.

What is claimed is:

1. A modified aggressive precharge method for controlling a DRAM, comprising the steps of:

receiving first and second groups of memory access commands wherein first activate and precharge command indicators are associated with the first group and second activate and precharge command indicators are associated with the second group;

detecting whether the memory access commands in the first and second groups are directed to the same bank and row of the DRAM; and conditionally suppressing, responsive to the detecting step, execution of the precharge command indicated by the first precharge command indicator and the activate command indicated by the second activate command indicator.

2. A method according to claim 1, wherein the detecting step comprises:

storing an address of the most recently activated row for each bank of a multi-bank DRAM; and, for each activate command indicator, comparing the address of the indicated row with the stored address of the most recently activated row for the corresponding bank; and associating a row comparison bit with the activate command indicator, the state of the row comparison bit reflecting the result of the comparing step.

3. A method according to claim 2, further comprising the steps of:

maintaining an active/inactive status bit for each bank of the multi-bank DRAM; and wherein the conditionally suppressing step comprises discarding an activate command indicator if the row comparison bit associated with the activate command indicator is asserted and the active/inactive status bit for the bank corresponding to the activate command indicator is also asserted.

4. A method according to claim 3, further comprising the steps of:

maintaining a skew count for each bank of the multi-bank DRAM; and each time an activate command indicator is discarded, incrementing the skew count for the corresponding bank.

5. A method according to claim 4, wherein the conditionally suppressing step further comprises:

for each precharge command indicator, if the skew count for the bank indicated by the precharge command indicator is nonzero, decrementing the skew count for the bank indicated by the precharge command indicator.

6. A modified aggressive precharge DRAM controller, comprising:

circuitry for receiving first and second groups of memory access commands wherein first activate and precharge command indicators are associated with the first group and second activate and precharge command indicators are associated with the second group;

circuitry for detecting whether the memory access commands in the first and second groups are directed to the same bank and row of the DRAM; and circuitry for conditionally suppressing, responsive to the detecting step, execution of the precharge command indicated by the first precharge command indicator and the activate command indicated by the second activate command indicator.

7. A DRAM controller according to claim 6, wherein the circuitry for detecting comprises:

circuitry for storing an address of the most recently activated row for each bank of a multi-bank DRAM; and, for each activate command indicator, circuitry for comparing the address of the indicated row with the stored address of the most recently activated row for the corresponding bank; and circuitry for associating a row comparison bit with the activate command indicator, the state of the row comparison bit reflecting the result of the comparing step.

8. A DRAM controller according to claim 7, further comprising:

circuitry for maintaining an active/inactive status bit for each bank of the multi-bank DRAM; and wherein the circuitry for conditionally suppressing is operable to discard an activate command indicator if the row comparison bit associated with the activate command indicator is asserted and the active/inactive status bit for the bank corresponding to the activate command indicator is also asserted.

9. A DRAM controller according to claim 8, further comprising:

circuitry for maintaining a skew count for each bank of the multi-bank DRAM; and each time an activate command indicator is discarded, circuitry for incrementing the skew count for the corresponding bank.

10. A DRAM controller according to claim 9, wherein the circuitry for conditionally suppressing further comprises:

for each precharge command indicator, if the skew count for the bank indicated by the precharge command indicator is nonzero, circuitry for decrementing the skew count for the bank indicated by the precharge command indicator.

11. A modified aggressive precharge DRAM controller, comprising:

a bank/column command queue;

a bank/row command queue; and a command processor for selecting a next command from one of the command queues;

wherein, when at least one command is available in each of the command queues, the command processor selects the next command from the bank/column command queue if the available bank/column command is of a type that would allow a bank/row command to be issued while the available bank/column command is still executing.

12. A DRAM controller according to claim 11, wherein:

when at least one command is available in each of the command queues, the command processor selects the next command from the bank/row command queue if the available bank/column command is of a type that would not allow a bank/row command to be issued while the available bank/column command is still executing.

13. A DRAM controller according to claim 11, wherein the DRAM controller is adapted to control a multi-bank DRAM, and wherein the DRAM controller further comprises:

registers for storing the address of the most recently activated row for each of the banks of the multi-bank DRAM;

a row address comparator for determining whether the row address indicated by a bank/row activate command is the same as that of the most recently activated row in the corresponding bank; and circuitry for associating a row comparison bit with the bank/row activate command to indicate the result of the comparison.

14. A DRAM controller according to claim 13, wherein the command processor is operable to discard rather than execute a bank/row activate command if the row comparison bit associated with the bank/row activate command is asserted and the bank indicated by the bank/row activate command is active.

15. A DRAM controller according to claim 14, further comprising:

a skew count register for each of the banks of the multi-bank DRAM; and circuitry for incrementing the corresponding skew count register when a bank/row activate command is discarded rather than executed.

16. A DRAM controller according to claim 15, wherein the command processor is operable to suppress execution of a precharge command that is expressed or implied in a column command whenever the skew count register corresponding to the column command contains a nonzero value.

17. A DRAM controller according to claim 16, further comprising: circuitry for decrementing the corresponding skew count register when execution of a precharge command is suppressed.

* * * * *